United States Patent
Toshima et al.

[11] Patent Number: 6,143,478
[45] Date of Patent: Nov. 7, 2000

[54] RESIST PROCESSING METHOD

[75] Inventors: Takayuki Toshima; Nobuo Konishi, both of Yamanashi-ken, Japan

[73] Assignee: Tokyo Electron Limited, Tokyo, Japan

[21] Appl. No.: 09/081,016

[22] Filed: May 19, 1998

[30] Foreign Application Priority Data

May 20, 1997 [JP] Japan .................................. 9-144552

[51] Int. Cl.[7] .................................................. G03F 7/40
[52] U.S. Cl. .......................... 430/330; 430/322; 430/324; 430/327; 430/349
[58] Field of Search ................... 430/324, 322, 430/327, 330, 349

[56] References Cited

U.S. PATENT DOCUMENTS

| 4,897,337 | 1/1990 | Kato | 430/296 |
| 5,919,598 | 7/1999 | Flaim | 430/271.1 |

FOREIGN PATENT DOCUMENTS

| 64-47026 | 2/1989 | Japan . |
| 2-101468 | 4/1990 | Japan . |

OTHER PUBLICATIONS

Research Disclosure RD 281017 A, Anonymous, "Planarising photoresist layer on semiconductor wafer—by soft baking, exposing through polka–dot mask, developing and reflow baking", abstract, Sep. 1987.

*Primary Examiner*—Kathleen Duda
*Assistant Examiner*—Nicole Barreca
*Attorney, Agent, or Firm*—Oblon, Spivak, McClelland, Maier, & Neustadt, P.C.

[57] ABSTRACT

A resist processing method includes (a), to a substrate having a circuit pattern with an uneven surface formed thereon, coating a photoresist solution to, by doing so, form a photoresist film, (b) subjecting the substrate to heat processing to cause a portion of the photoresist film to be chemically modified to create a modified resist layer of a substantially uniform thickness from the uneven surface of the circuit pattern, and (c) selectively removing only a resist portion unmodified at the step (b) to leave a modified resist layer on the uneven surface of the circuit pattern.

13 Claims, 7 Drawing Sheets

RESIST PROCESSING METHOD

BACKGROUND OF THE INVENTION

The present invention relates to a resist processing method and resist processing apparatus for coating and forming a thin-film, such as a photoresist film, on a substrate such as a semiconductor wafer having an already formed circuit pattern with an uneven/stepped surface.

The photolithography process for manufacturing a semiconductor device includes coating a photoresist solution on the surface of a semiconductor wafer to form a resist film, baking this resist film, exposing the film with light with the use of a pattern and subjecting it to a develop-processing.

Figure 1:
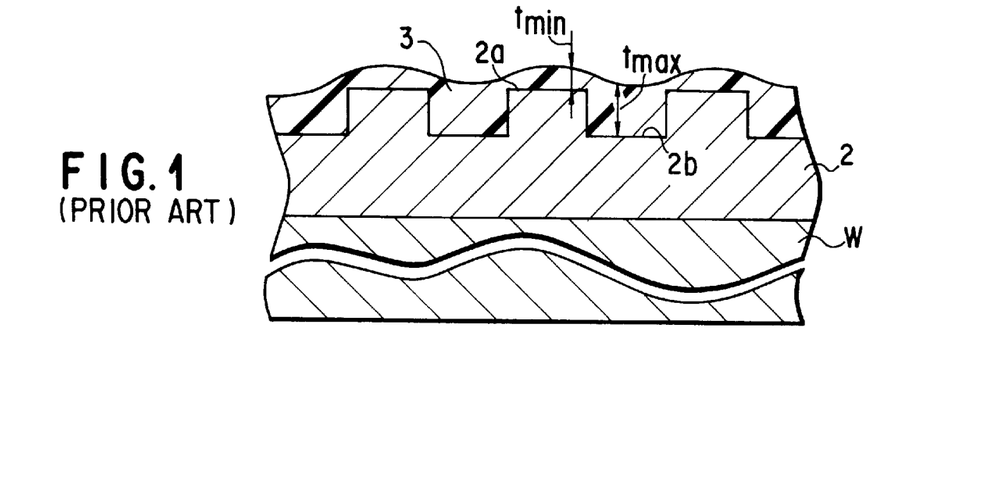
FIG. 1 is a longitudinal cross-section view showing a resist coating film formed, by a prior art method, on an uneven surface of a pattern on a semiconductor wafer.

In the process of coating the photoresist film, use is made of the so-called spin-coating method by which the wafer, being spun, is supplied at its center surface area with a resist solution and the resist solution is diffused under a centrifugal force over a whole wafer surface. In the case where a resist solution is coated on an uneven/stepped surface of a wafer W with a circuit pattern layer 2 already formed thereon, a thickness tmin of a resist film 3 on a top area 2a becomes extremely smaller than a thickness tmax of the resist film on a bottom area 2b as shown in FIG. 1. If, therefore, in a subsequent light exposure step, the next circuit pattern is subjected to light exposure, there is a risk that there will arise a variation in the width of a light beam. Such a light beam width variation tendency emerges more prominently when the light exposure wavelength becomes short from an i line to a KrF excimer laser.

In recent times, the light beam width of a circuit pattern for the semiconductor device is more and more microminiaturized and there is a high demand that the thickness of the resist film be further reduced.

BRIEF SUMMARY OF THE INVENTION

It is accordingly the object of the present invention to provide a resist processing method, comprising:

(a), to a substrate having a circuit pattern with an uneven surface formed thereon, coating a photoresist solution to, by doing so, form a photoresist film;

(b) subjecting the substrate to heat processing to chemically modify a portion of the photoresist film to, by doing so, create a modified resist layer of a substantially uniform thickness from the uneven surface of the circuit pattern; and (c) removing only a resist layer unmodified at the step (b) to leave the modified resist layer on the uneven surface of the circuit pattern.

In the step (a), use can be made of, for example, a spin coating method. It is preferable that the thickness of the resist film 3 be made thicker than a conventional counterpart. It is preferable that the film thickness of the resist film 3 be variously set, in a range of 300 to 900 nm for instance, in accordance with the thickness of the pattern layer 2. Incidentally, the pattern layer 2 contains a source electrode, gate electrode, element isolation region, etc., and a high/low difference between the top 2a and the bottom 2b is as great as about 200 nm. And the thickness t5 of the modified layer 3a is required to be at least 100 nm. It is, therefore, necessary that an initial film thickness t4 from the bottom 2b be made as large as above 300 nm. If, on the other hand, the resist solution coating film 3 is extremely thicker, it takes too much time to remove the non-modified layer 3b. It is preferable that the initial film thickness t4 of the resist solution coating film 3 be made below 900 nm. It is to be noted that, for the resist, the thickness of the modified layer is set to be 500±50 nm.

Further it is preferable to provide, before the step (a), an anti-reflection film forming step for covering the uneven surface of the circuit pattern with a hard-to-reflect bottom anti-reflection coating film. The anti-reflection film forming step preferably comprises the step (A) of coating a solution for an anti-reflection film to the uneven surface of the pattern, the step (B) of subjecting the substrate to heat processing to cause a portion of the anti-reflection film to be chemically modified to create a modified layer of a substantially uniformly thick anti-reflection film from the uneven surface of the pattern and the step (C) of removing only a layer unmodified at the step (B) to leave the modified layer on the uneven surface of the pattern. In this case it is preferable that the coating film thickness of the anti-reflection film be made thicker than a conventional thickness of 80 to 90 nm. More preferably, a film thickness from the bottom 2b be set to be 250 to 350 nm. Further, the thickness t5 of the modified layer is set to be 100±20 nm for the anti-selection film.

Here, the term "modified" is intended to mean that the coated resist film and anti-reflection film are changed or altered in their chemical property, such as the modified portion as distinct from the non-modified portion is not dissolvable in a specific chemical solvent or is strongly resistant to the ashing processing and etching processing.

An explanation will be given below about the heat processing for forming the resist's modified layer 3a.

When the substrate is heated from its rear surface side, heat is uniformly transmitted through the substrate. If any uneven or stepped surface is formed on the substrate surface, the heat thus transmitted through the substrate is transmitted past the uneven or stepped surface of the pattern uniformly into the resist film until it reaches a modified resist film portion of an intended predetermined depth. When this occurs, the heat processing is stopped so as to stop the transmission of the heat. By doing so, it is possible to form a modified layer and non-modified layer. Such heating temperature/heating time condition is properly set in accordance with the high/low difference of the uneven surface of the pattern.

It may also be considered that, since the photoresist is sensitive to temperature, heat is inadvertently transmitted through the resist film before the step (b) following the step (a) and it is not possible to create an intended modified layer and non-modified layer. For this reason, heating is done from the rear surface (lower surface) side of the substrate and cooling is made from the upper side of the substrate, so that it is possible to prevent the suppression of the heat transmission rate as well as the progress of an inadvertent heat transmission and consequent failure of desired unmodified and modified layers to be created. That is, according to the present invention it is possible to control the transmission of the heat and ensure the easiness with which any desired modified and non-modified layers are created.

Figure 8A:
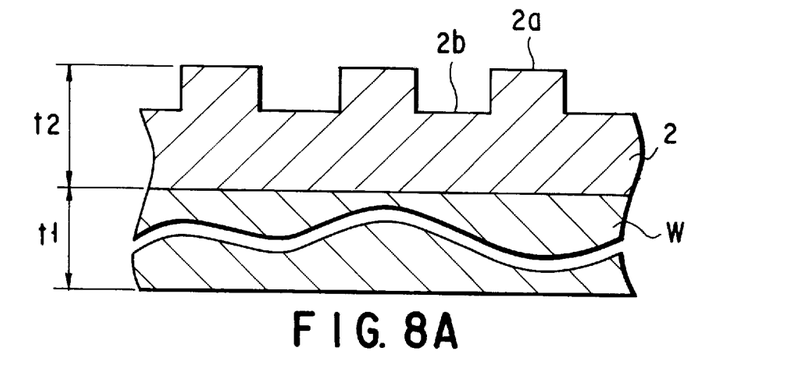
FIGS. 8A to 8E are cross-sectional views, partly enlarged, showing a semiconductor wafer.
Figure 8B:
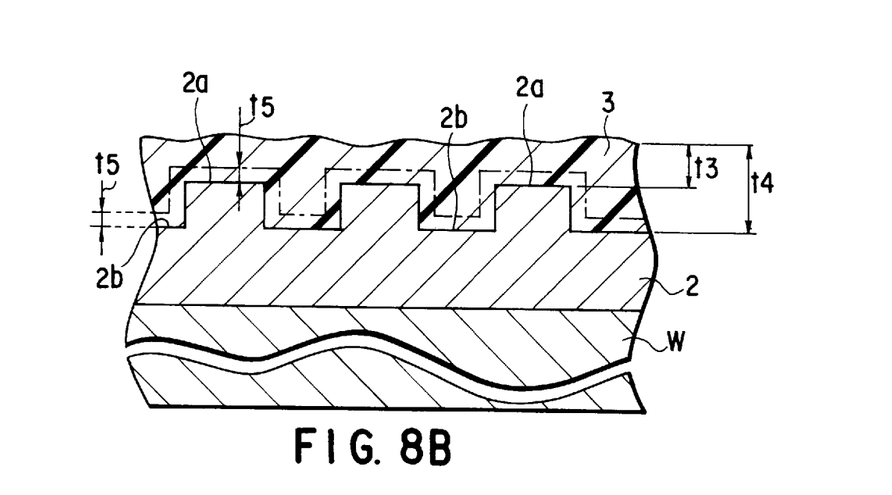
Figure 8C:
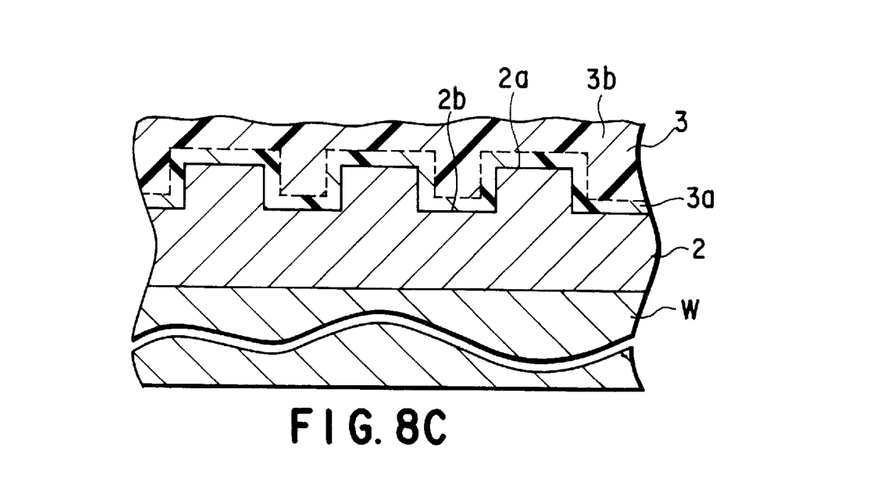
Figure 8D:
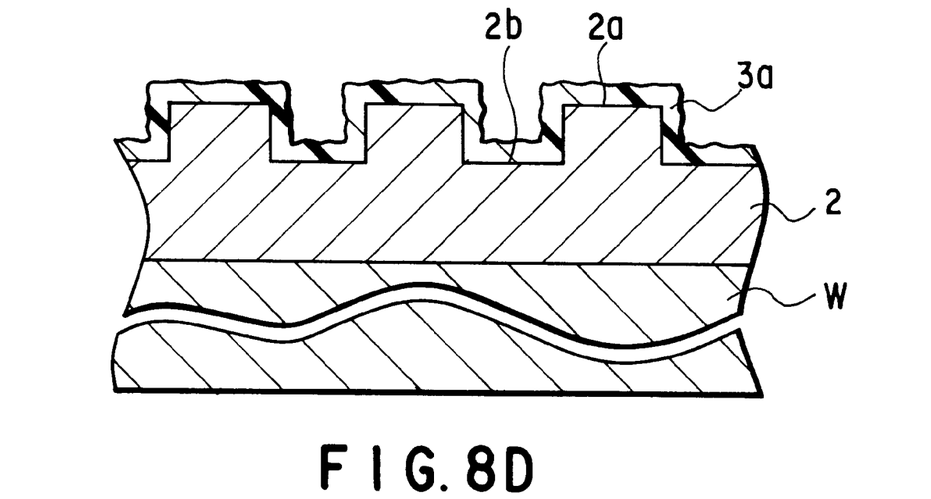
Figure 8E:
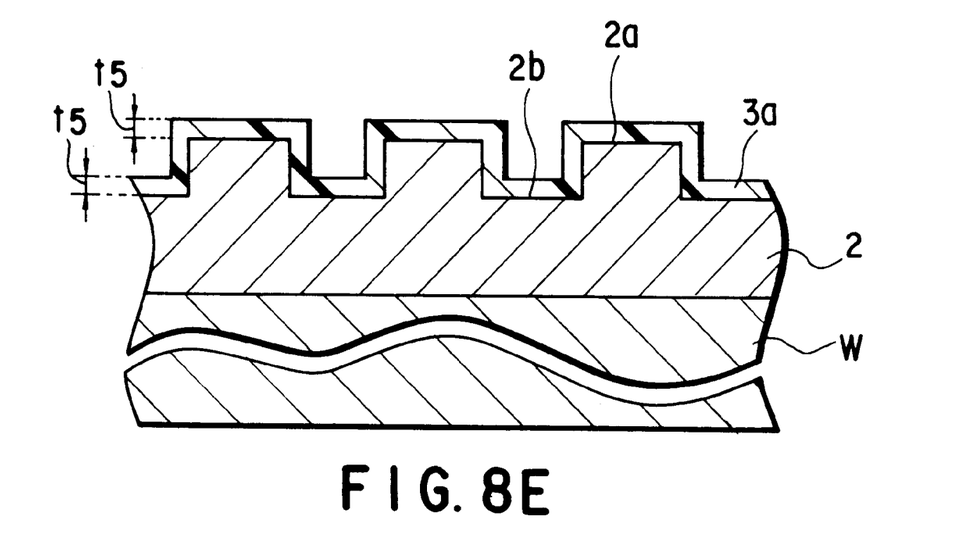

As set out above, if subsequent to the creation of the modified and non-modified layers the non-modified layer is removed, then the modified layer (resist film) of the same thickness is left on the top 2a and bottom 2b of the pattern in a manner to follow the uneven surface of the pattern as shown in FIG. 8E.

As a solution for removing the non-modified layer 3b, use is preferably made of an organic solvent, such as a thinner. Further, the non-modified layer 3b may also be removed using a developing solution, an IPA (isopropyl alcohol) or other not-too-high-dissolution organic solvent as the dissolving solution. The non-modified layer may be removed by the ashing processing.

It is preferable to smooth the surface (surface portion) of the resist's modified layer flat by subjecting the substrate to heating processing after the step (c) as already set out above. This is because, if the resist film has the uneven surface, there is a risk that the exposure light will be scattered on the uneven surface.

It is desirable that, in the above-mentioned step (b), the photoresist solution coating film be heated from the rear surface side of the substrate, while cooling the photoresist solution coating film from an upper surface side of the substrate. By cooling the upper surface side of the substrate the upper layer (surface layer) of the resist film is not modified and only the lower layer (bottom layer) is modified.

In the above-mentioned step (b), the substrate is placed on the stage in a way to be partially supported only at its marginal edge portion in a contacting state and a heat energy radiation is emitted from the stage side toward the rear surface of the substrate. For this reason, a resistance heat generation heater is embedded in the substrate placing stage to use such a heat energy radiation means (heating means). It is to be noted that as the heating means use may be made of an infrared radiation heater.

Further, in the step (b), the radiation cooling plate may be moved nearer the upper surface side of the substrate to subject the photoresist solution coating film to radiation cooling or a cooling gas may be fed to the upper surface side of the substrate to cool the photoresist solution coating film.

A resist processing apparatus according to the present invention comprises a processing chamber, a stage provided in the processing chamber and supporting a substrate having a circuit pattern with an uneven surface formed thereon, a heating mechanism for heating the substrate on the stage from a rear surface side of the substrate, and a cooling mechanism for cooling the substrate on the stage from the upper surface side of the substrate.

According to the resist processing device, the substrate is heated on the rear surface (lower surface) side of the substrate with the substrate placed on the stage while cooling the upper surface side of the substrate. It is, therefore, possible to prevent the suppression of a heat transmission rate from the rear surface (lower surface) as well as the progress of an inadvertent heat transmission.

The heating mechanism can be realized by either incorporating a heat generation element in the stage or incorporating a heat exchanger in the stage through which a heat fluid passes. On the other hand, the cooling mechanism may be constructed by either locating a cooling plate just opposite to the stage to pass a coolant through the cooling plate or using electronic cooling members utilizing a peltier effect. Further, it may be possible to blow, against the photoresist layer, a chemically hard-to-react substance, for example an inert gas such as $N_2$ gas, argon gas or helium gas.

Additional objects and advantages of the invention will be set forth in the description which follows, and in part will be obvious from the description, or may be learned by practice of the invention. The. objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Various preferred embodiments of the present invention will be explained below with reference to the accompanying drawings.

Figure 2:
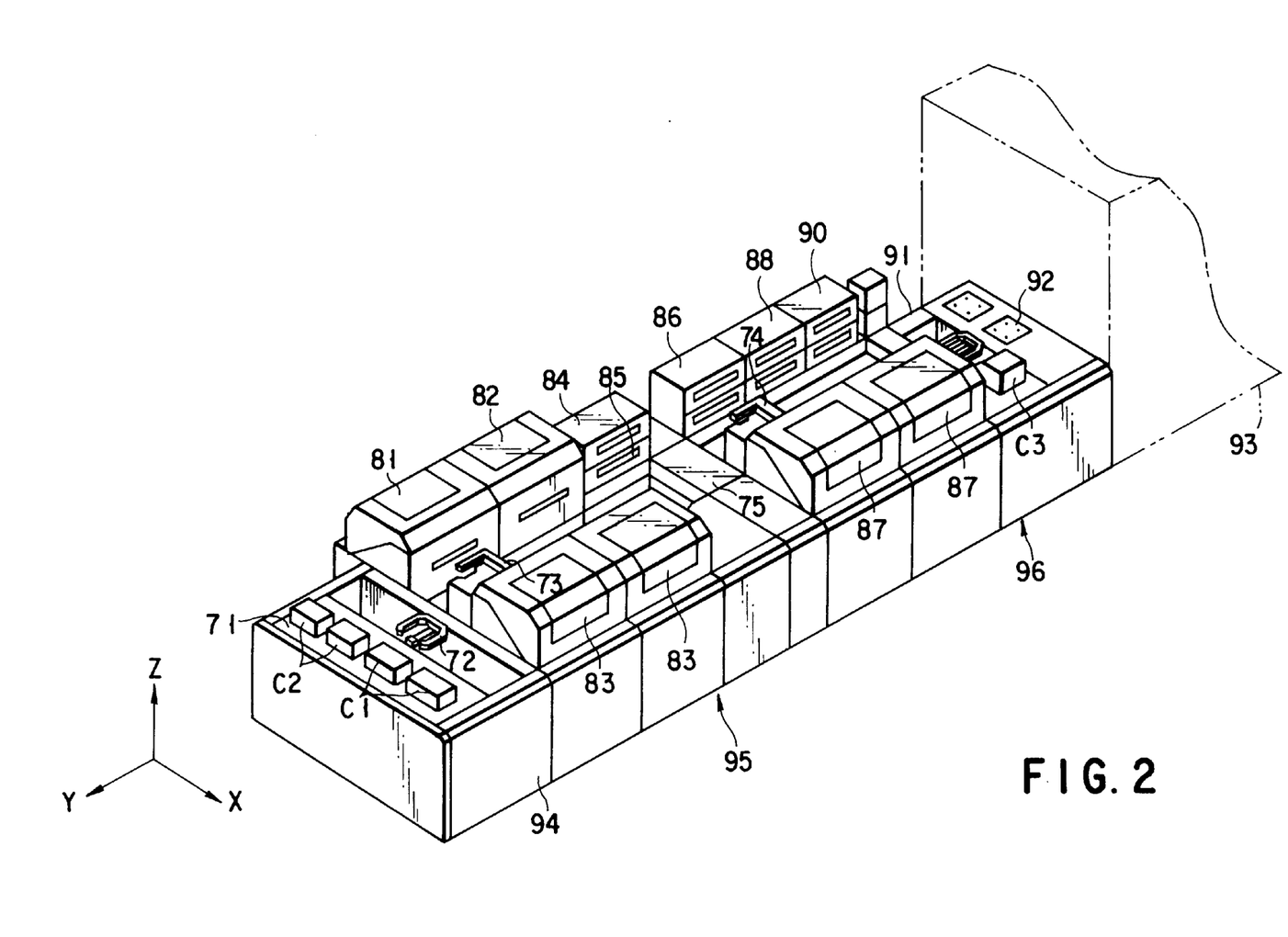
FIG. 2 is a perspective view generally showing a substrate processing system.

As shown in FIG. 2, a substrate processing system includes a cassette station 94, a processing station 95 and an interface section 96. The cassette station 94 has a stage 71 and a sub-arm 72. Four cassettes C1, C1, C2, C2 are placed on the stage 71. By the sub-arm mechanism 72, an unprocessed semiconductor wafer W is taken out from the cassette C1 on the stage 71 and a processed semiconductor wafer W is returned by the sub-arm 72 back to the cassette C2.

The processing station 95 comprises a preceding stage section and a subsequent stage section, the preceding stage being connected to the cassette station 94 and the subsequent station being connected to the interface section 96. Various processing units 81 to 85 for subjecting a semiconductor wafer W to resist processing, as well as a first main arm mechanism 73, are provided at the front stage section of the processing station 95. The first main arm section 73 takes the wafer W from the sub-arm mechanism 72, moves it along a Y-axis conveying path and conveys it to the processing units 81 to 85. Various processing units 86 to 88, 90 for subjecting the semiconductor wafer W to resist processing, as well as a second main arm mechanism 74, are provided on the subsequent stage of a processing station 95. The second main arm mechanism 74 takes the wafer W from the first main arm mechanism 73, moves it along the Y axis conveying path and conveys it to the processing units 86 to 88 and 90.

The processing units 81, 82, 83, 87 correspond to solution processing (spinner)-series units for subjecting the wafer W to resist-coating, develop-processing and wash-processing, while spinning the wafer W. On the other hand, the processing units 84, 85, 86, 88, 90 correspond to the heat processing units for heating and cooling the wafer W. Among these, the resist coating unit 87 and baking unit 90 constitute component elements of the resist processing apparatus of the present invention. Such a resist coating unit 87 is described in, for example, U.S. Pat. No. 5,672,205.

The interface section 96 is provided adjacent to a light exposure apparatus 93. The interface section 96 includes a second sub-arm mechanism 91 for passing the semiconductor wafer W to and from the main arm mechanism 74 of the processing station 95, a passing stage 92 for passing the wafer W to and from the light exposure device 93, and a buffer cassette C3 for holding the wafer W in a processing standby state. It is to be noted that a conveying arm mechanism, not shown, is provided on the light exposure device 93 side to allow the wafer W to be taken from on the passing stage 92 and conveyed to a stepper, not shown.

Figure 3:
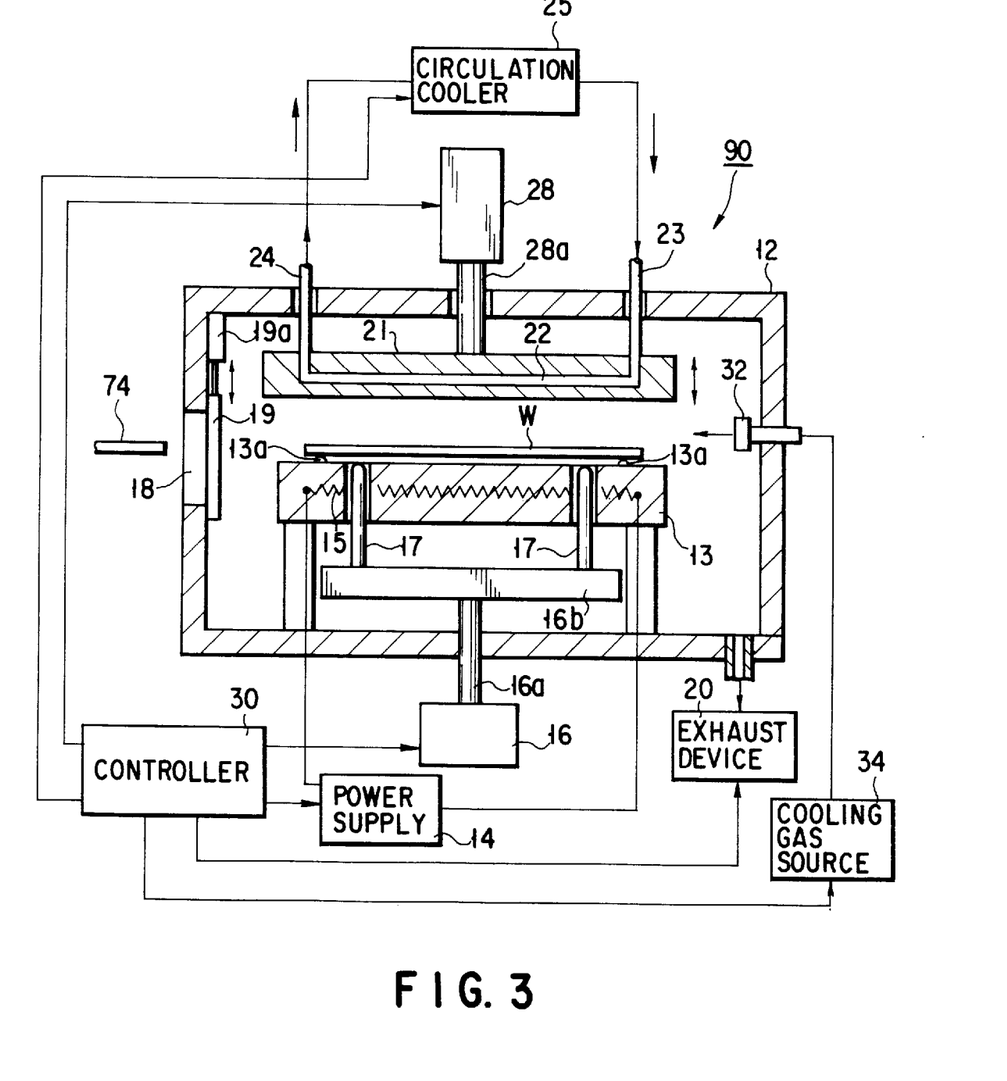
FIG. 3 is an inside see-through block diagram showing a resist film forming apparatus according to an embodiment of the present invention.

Then, the baking unit 90 will be explained below with reference to FIG. 3.

In the baking unit 90, a resist film 3 over a wafer W is heated to allow a portion of the resist film 3 to be chemically modified, so that a modified layer 3a insoluble in an organic solvent (thinner) is formed there. The baking unit 90 is equipped with a processing container (chamber) 12 having a wafer load/unload opening 18. A stage 13 and radiation cooling member 21 are provided in the processing container 12. A shutter 19 is provided on a side wall of the processing container 12 and driven in an up/down direction to open and close the wafer load/unload opening 18. A plurality of pads 13a are provided on the marginal edge portion of the upper surface of the stage 13. Only the marginal edge portion of the wafer W is supported by these pads 13a in a contacting relation but the central portion of the wafer W is set near the stage 13 in a non-contacting relation.

Figure 4:
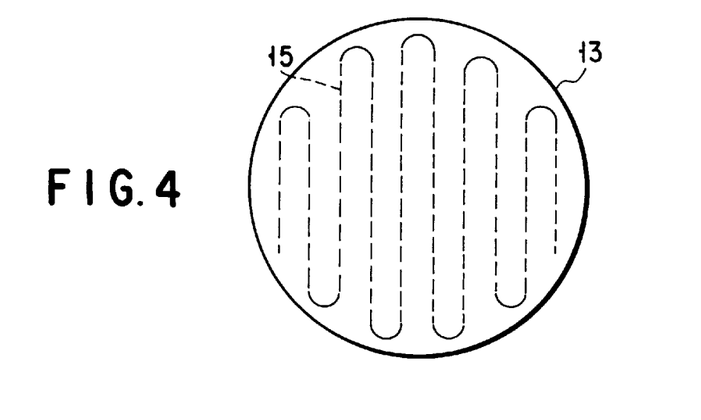
FIG. 4 is a plan view showing a stage with a heater embedded as a modified layer forming means.

A resistance heat generation heater 15 is embedded as a heating mechanism in the stage 13 and connected to a power supply 14 controlled by a controller 30. As the heating mechanism on the rear surface side of the wafer use may be made of, in addition to the resistance heat generation heater, an infrared radiation heater and so on. The heater 15 is so meandered as to cover a whole area of the stage 13 as shown in FIG. 4.

The stage 13 has three through holes in its marginal edge portion through which corresponding pins 17 can extend to allow the wafer W to be lifted upward above the stage 13. The three pins 17 are coupled through a coupling support member 16b to a rod 16a of the lifting cylinder 16.

An exhaust hole 20 is provided in the bottom of the processing container 12 to communicate with an exhaust device 36. As a result, the interior of the processing container 12 is exhausted downwardly. If, in this way, the interior of the processing container 12 is exhausted downwardly, heat generated at the buried heater is less transmitted to the upper radiation cooling member 21. A gas nozzle 32 is provided in a side wall of the processing container 12 to supply a cooling gas 32 from a cooling gas source 34 via a nozzle 32 into the processing container 12. A jet outlet of the nozzle 32 is directed toward the stage 13 to supply a cooling gas to the upper surface of the wafer W. It is to be noted that the cooling gas source 34 and exhaust device 36 are controlled by the controller 30 and that an inert gas, such as a $N_2$ gas and helium gas, is stored in the cooling as source 34.

The radiation cooling member 21 serving as a cooling mechanism is provided in the processing container 12 in a way to confront the stage 13. An inner passage 22 is formed in the radiation cooling member 21 and an inlet and output 22a and 22b of the inner passage 22 are connected to an inlet tube 23 and outlet tube 24, respectively, between which a circulation cooler 25 is provided for communication. The circulation cooler 25 stores a refrigerant, such as a coolant and chilling agent. Further, the radiation cooling member 21 is coupled to a rod 28a of a lifting cylinder 28 such that it is liftably supported. The lifting cylinder 28 is controlled by the controller 30.

As the cooling mechanism use may be made of a something like a shower head for jetting the cooling gas downwardly. Further, the control of the cooling temperature can also be achieved by controlling the temperature of the refrigerant and cooling gas. This may be achieved by varying the distance between the radiation cooling member 21 or shower head, not shown, on one hand and the semiconductor wafer W on the other.

Figure 5:
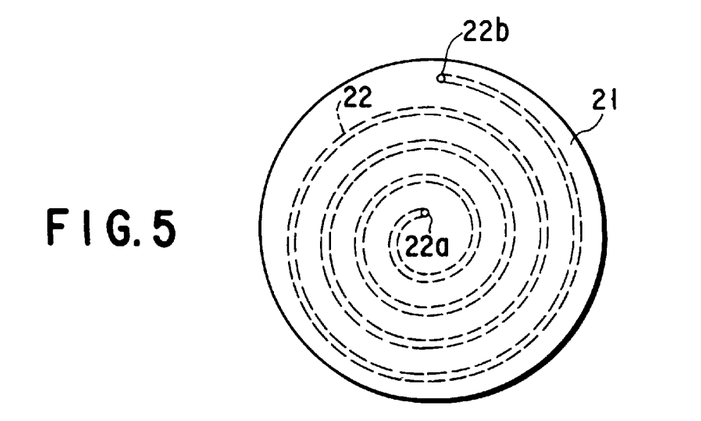
FIG. 5 is a plan view showing a cooling member.

As shown in FIG. 5, the inner passage 22 is so formed at the radiation cooling member 21 as to provide a spiral configuration with its inlet 22a at a center area (center area of the radiation cooling member) 21 and its outlet 22 at the marginal edge portion of the radiation cooling member 21.

A resist processing method relating to a first aspect of the present invention will be explained below with reference to FIGS. 6, 7 and 8A to 8E.

Figure 6:
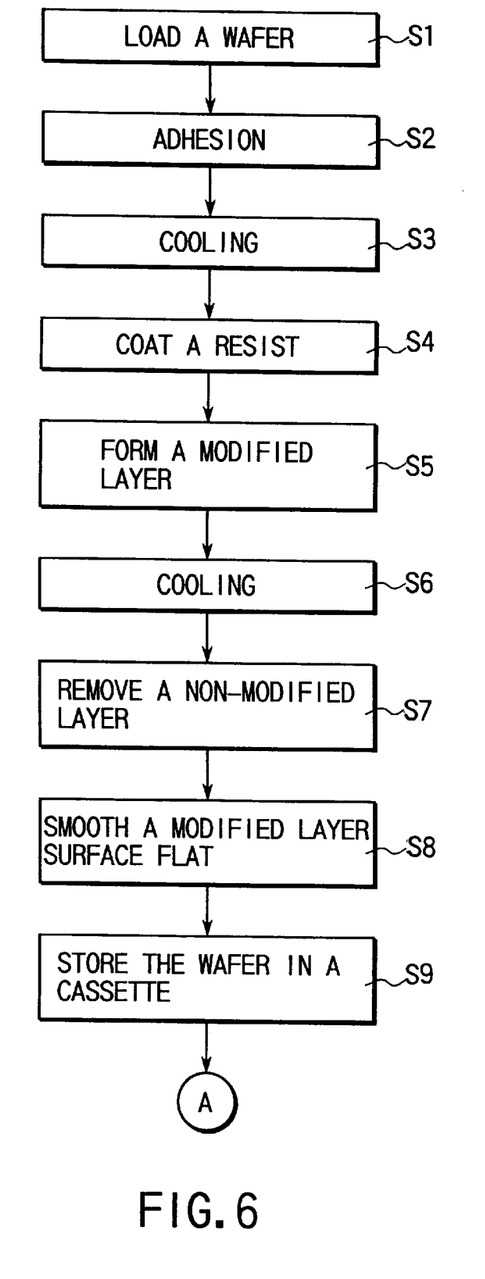
FIG. 6 is a flow chart showing a method for forming a resist film on the embodiment of the present invention.

As shown in FIG. 8A, a silicon wafer W to be processed has an already formed circuit pattern layer 2 at its surface side of an uneven surface. The dimension of this silicon wafer structure is such that the wafer thickness t1 is 720 $\mu$m, the thickness of the circuit pattern layer 2, about 500 nm (5000Å), and the maximal height difference between a top 2a and a bottom 2b, about 200 nm (2000Å). Such a wafer W is conveyed to the process section 95 (step S1). In the process section 95, first it is conveyed to an adhesion unit 84 and, under an atmosphere of an HMDS steam, the wafer surface is subjected to hydrophobic processing (step S2). Then the wafer is cooled down to nearly room temperature (step S3) and then conveyed to a coating unit 83.

The wafer W is placed on a spin chuck in the coating unit 83 and, being spun, coated with a resist solution (step S4). This resist spin-coating step S4 is done to allow the resist film thickness t3 on a top 2a of the circuit pattern layer to be greater than the resist film thickness t5 of a modified layer 3a, to be formed, as shown in FIG. 8B. For example, assuming that the film thickness t5 of a modified layer 3a to be formed is set to be 500 nm, the thickness t3 on the top 2a is set to be 900 nm. It is to be noted that the resist film thickness t4 on the button 2b becomes greater than a conventional resist film thickness.

After the coating of the resist, the wafer W is conveyed into the baking unit 90 and placed on the stage 13. The wafer W is supported by the pads 13a at the marginal edge portion in a partially contacting state and the main remaining portion of the wafer W is located in a non-contacting state. When the stage 13 is heated, by the heater 15, to a temperature of, for example, 140° C., a heat energy radiation is emitted from the stage 13 toward the rear surface of the wafer W to heat the rear surface of the wafer W through radiation heating. When this is done, the coated resist film 3 begins to be modified from the uneven surface side of the circuit pattern layer 2 and the modified film is gradually grown to provide a modified layer 3a of a desired thickness t5 (step S5). At this time, the wafer surface (coated resist film 3) is radiation-cooled by the radiation cooling member 21. Further, a cooling gas is supplied from the nozzle 32 toward the surface of the wafer W and, through the gas cooling, an enhanced cooling effect is exerted over the surface layer portion of the coated resist film 3. By doing so, as shown in FIG. 8C, the modified layer 3a is formed from the rear surface (lower surface) side of the wafer and the coated resist layer on the upper surface side remains unmodified to provide a non-modified layer 3b. In order to provide a double resist layer structure comprised of the modified layer 3a and non-modified layer 3b, it is necessary that the heat processing conditions, such as a heating temperature, heating time, cooling temperature, cooling time, etc., be made optimal in accordance with the resist processing conditions. In this connection it is to be noted that actual measurement data for making the modified layer 3a at a desired thickness t5 is initially found, in conjunction with the heating temperature, heating time, etc., conditions, with the use of a dummy wafer, etc., and initially stored in memory in the controller 30 so that these storage data items can be called from the memory as necessity arises.

At steps S4 and S5, the modified layer 3a may be formed by, while coating the resist solution on the wafer W, heating the wafer W. Further, the modified layer 3a may be formed by heating the water W while supplying a resist solution under a low temperature atmosphere in the container where the coating step is being done.

Even after stopping the heating by the heater and ending the modified layer forming step S5, the radiation cooling by the radiation cooling member 21 as well as the gas cooling via the nozzle 32 is continued and the wafer W in the baking unit 90 is immediately cooled (step S6). It is to be noted that, at step S6, the wafer W may be cooled in the cooling unit 85.

Then the wafer W is loaded into the coating unit 83 and an organic solvent is applied from the solvent nozzle to the wafer W to remove only the non-modified layer 3b off the resist film (step S7). By doing so, the resist's modified layer 3a of a substantially uniform thickness is left on the water W. An average film thickness t5 of the modified layer 3a is 200 nm. In step S7, it is preferable to use chemicals, such as a substance for allowing only the non-modified layer 3b of the resist film to be dissolved and a substance by which the rate of dissolution of the modified layer is extremely lowered. As such substance, use can be made of various kinds of thinners and developing solutions. Further, the non-modified layer 3b may be removed by ashing processing and, in this case, the ashing condition is such as to lower the rate of ashing on the modified layer 3a.

As shown in FIG. 8D, the resist's modified layer 3a has an exposed uneven surface and, since the uneven surface may involve a risk of causing exposure light to be scattered, has to be smoothed flat. The wafer W is loaded into any of the baking units 86, 88, 90 and heated to a predetermined temperature. By doing so, the resist's modified layer 3a has its surface (surface portion) softened and has its solvent which is contained in the modified layer to be volatilized, so that the surface of the modified layer 3a is smoothed flat as shown in FIG. 8E (step S8). The heating condition at step S8 is: the temperature within a range of 80 to 120° C. and the heating time within a range of 60 to 120 seconds. The thus processed wafer W is stored in the cassette C3 of the interface section 96 (step S9).

Figure 7:
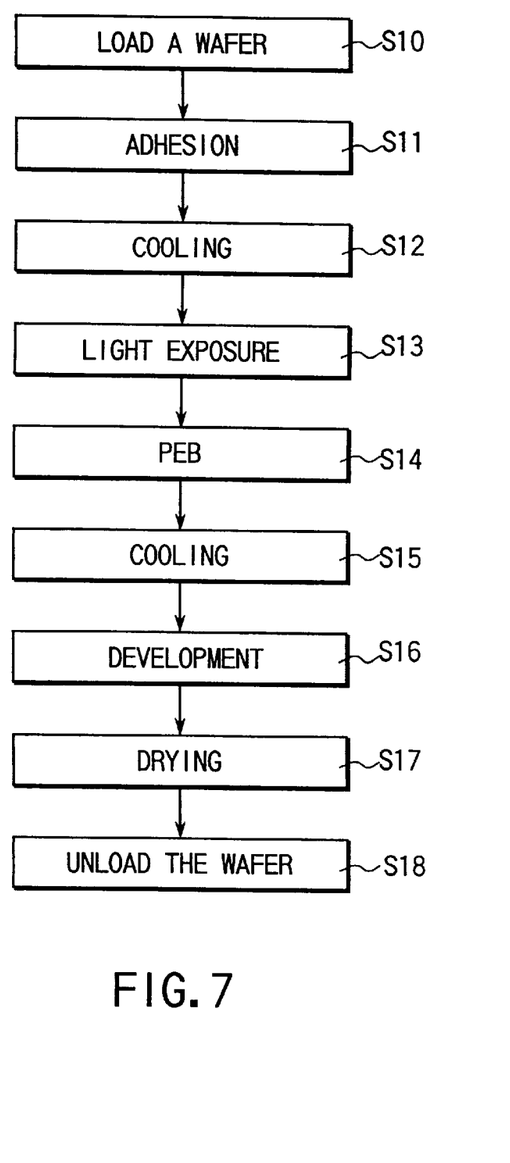
FIG. 7 is a flow chart showing the method for forming the resist film on the embodiment of the present invention.

The wafer W is taken out of the cassette C3 and again loaded into the processing station 95 (step S10). In the processing station 95, the wafer W is first loaded into the adhesion unit 84 and subjected to hydrophobic processing under an atmosphere of an HMDS steam (step S11). Then the wafer W is loaded into any one of the cooling units 85, 86 and it is cooled down to about room temperature (step S12).

Then, the wafer W is loaded into the light exposure device 93 and its modified layer 3a is subjected to a pattern light exposure (step S13). In the case where the resist's modified layer 3a is comprised of a chemically amplified type resist, for example, use is made, as exposure light, KrF excimer laser light for instance. Since, at the resist's modified layer 3a, the film thickness on the top 2a and that on the bottom 2b are substantially equal to each other, that is, have a thickness of t5, a pattern latent image formed at that time involves no variation in light beam line. Further, the resist's modified layer 3a is so formed as to follow the uneven outline of the already formed pattern and it is, therefore, possible to largely reduce the modified layer to a thickness as small as t5.

Then the wafer W is loaded into the baking unit 90 and subjected to post-exposure baking (step S14). After cooling the wafer W (step S15) it is loaded into the develop-processing unit 87 and a developing solution is applied to the light-exposed resist's modified layer 3a to allow it to be develop-processed (step S16). After the develop-processing step, the wafer W is rinsed with pure water and heated to dryness (step S17). When, in this way, a series of resist processing steps have been completed, the wafer W is stored into the cassette C2 of the cassette station 94 and delivered in cassette units.

A resist processing method relating to a second aspect of the present invention will be explained below with reference to FIGS. 9, 7, 6 and 8A to 8E.

Figure 9:
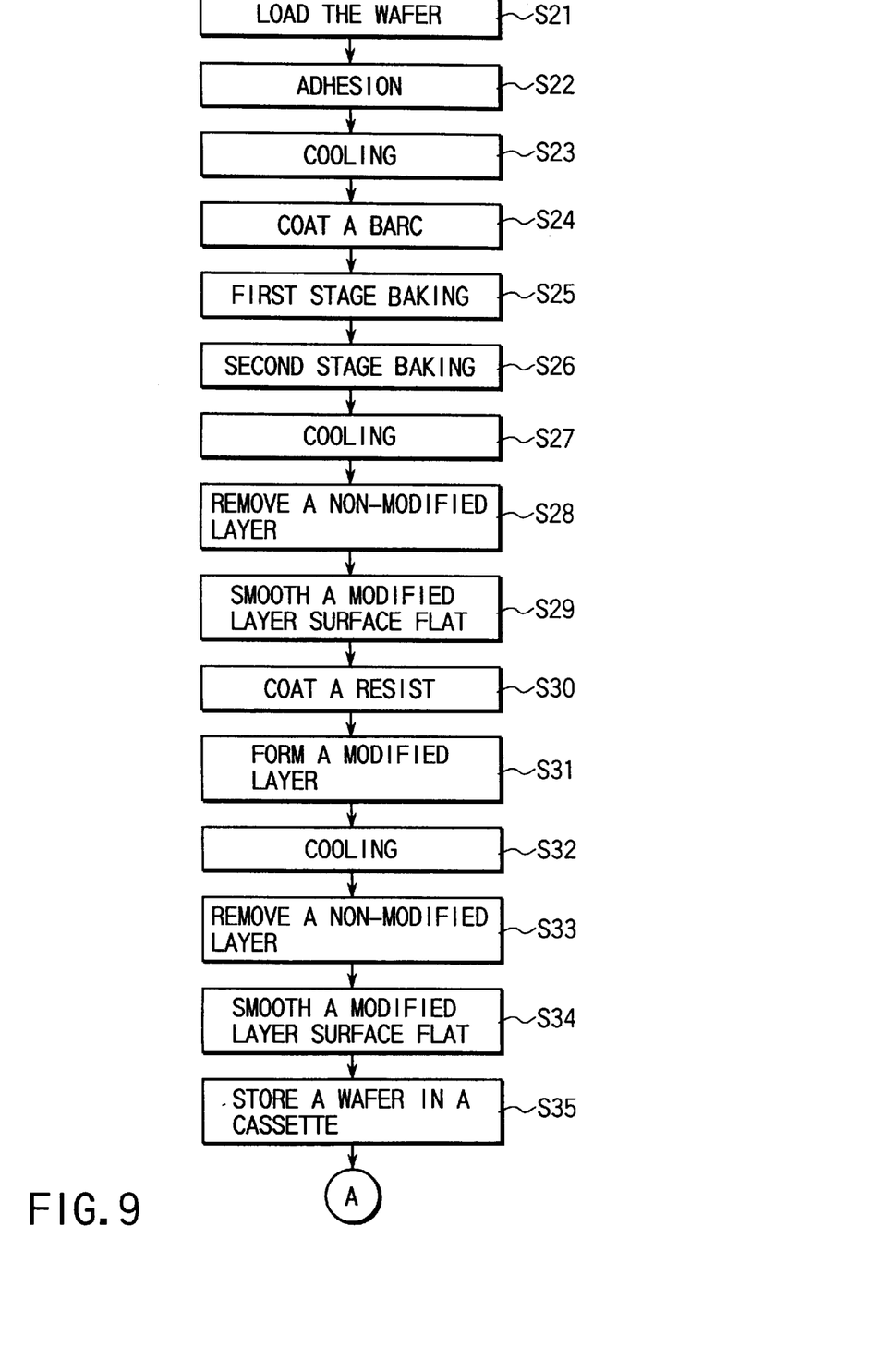
FIG. 9 is a flow chart showing another method for forming a resist film on the embodiment of the present invention.

A wafer W is loaded from the cassette station 94 into the processing section 95 (step S21). In the processing section 95, it is loaded into the adhesion unit 84 and subjected to hydrophobic processing under an HMDS steam atmosphere (step S22). Then the wafer W is loaded into the cooling unit 85 and cooled down to about room temperature (step S23) and then loaded into the coating unit 83.

The wafer W is placed on a spin chuck in the coating unit 83 and, being spun, coated with a solution for a bottom antireflection coating film (hereinafter referred simply to a BARC)—step S24. In the BARC coating step S24, as shown in FIG. 8B, a film thickness t3 on a top 2a is made greater than a film thickness t5 of a modified layer to be formed. In the case where the film thickness t5 to be formed as a modified layer is set to 100 nm, the film thickness t3 on the top 2a is set to 300 nm. It is to be noted that the BARC film thickness t4 on the bottom 2b becomes thicker than a conventional counterpart.

After the coating of the BARC, the wafer W is loaded into the baking unit 90 and placed on the stage 13. The wafer W is partially supported by pads 13a at its marginal edge portion in a contacting state with a remaining major portion of the wafer W set over the stage 13 in a non-contacting state. When the stage 15 is heated by the heater 15 to a temperature of, for example, 180° C., a heat energy radiation is emitted from the stage 15 to the rear surface of the wafer W to allow the rear surface of the wafer W to be radiation-heated (first stage baking S25). By the first stage baking, a solvent is volatilized from the BARC layer. When an increasing amount of electric energy is fed to the heater 15 to heat the stage 15 to a temperature of, for example, 250° C., the BARC layer begins to be modified from an "uneven surface" side of a pattern layer. The BARC layer 3 is gradually grown to provide a modified layer of a desired thickness t5 (second stage baking step S26) and, at this time, the surface (BARC layer) of the wafer W is subjected by the radiation cooling member 21 to radiation cooling. Further, a cooling gas is fed from the nozzle 32 to the surface of the wafer W, so that an enhanced cooling effect is exerted by a gas cooling over the surface portion of the BARC layer. By doing so, as shown in FIG. 8C, a modified layer is created from a rear surface (lower surface) side and an upper surface side of the wafer structure remains unmodified to provide a non-modified layer. In order to create a double BARC layer structure comprising such modified layer and non-modified layer, it is required that the heating processing conditions such as the heating temperature, heating time, cooling temperature, cooling time, etc., be made optimal in accordance with the resist processing condition. It is to be noted that the above-mentioned second baking (step S26) may be continued after the first baking step or it may be done after the first stage baking step and subsequent step for cooling the wafer W to room temperature.

In the steps S24 to S26, the modified layer may be formed by heating the wafer W while coating it with a solution for a BARC. Further, the modified layer may be formed by heating the wafer W while supplying a solution for BARC under a low temperature atmosphere in the container in which a coating step is being done.

Even after the heating step using the heater and step of the formation of the modified layer (S5), the radiation cooling by the radiation cooling member 21 as well as the gas cooling via the gas nozzle 32 is continued to cause the wafer W to be immediately cooled in the baking unit 90 (step S27). It is to be noted that the wafer W may be cooled at a different place.

Then the wafer W is loaded into the coating unit 83 and an organic solvent is applied from a solvent nozzle to the wafer W and only a non-modified layer of the BARC is dissolved and removed (step S28), so that a BARC modified layer of a uniform thickness is obtained on the wafer W as a remaining layer. The film thickness t5 of the BARC modified layer is 80 to 90 nm. In the step S28, it is preferable to use chemicals such as a substance for allowing only a non-modified layer of the BARC to be dissolved and a substance by which the rate of dissolution of the modified layer is extremely lowered. As such chemicals use can be made of various kinds of thinners and developing solutions. Further, the non-modified layer may be removed by the ashing processing and, in this case, the ashing condition is such as to allow the BARC modified layer to be ashed by a low ashing rate.

As shown FIG. 8D, the exposed surface of the BARC modified layer is uneven and there is a risk that exposure light will be scattered on the exposed uneven surface of the modified layer. It is, therefore, necessary to smooth the exposed uneven surface of the modified layer flat. The wafer W is loaded into any of the baking units 86, 88, 90 and heated to a predetermined temperature. By doing so, the BARC modified layer has its surface portion softened to allow an unrequired solvent which is contained in the modified layer to be volatilized. This smoothes the surface of the BARC modified layer flat (step S29). The heating condition at this step is such as to heat the layer at a temperature of 90 to 150° C. for a time of 60 to 120 seconds.

Then the wafer W is loaded into the cooling unit 85 and cooled down to about room temperature and then loaded into the coating unit 83. In the coating unit 83 a resist solution is coated on the wafer W while spinning the wafer W on a spin chuck (step S30). In this resist coating step S30, a film thickness t3 on the top 2a of the circuit pattern layer is made greater than a film thickness t5 to be formed as the modified layer 3a. In the case where the film thickness t5 is set to 300 nm, the film thickness t3 on the top 2a is set to 600 nm. It is to be noted that the resist film thickness t4 on the bottom of the circuit pattern formation layer is made thicker than a conventional counterpart.

After the coating of the resist, the wafer W is loaded into the baking unit 90 and placed on the stage 13. The wafer W is partially supported by pads 13a at its marginal edge portion in a contacting state with a remaining major portion of the wafer W set on the stage 13 in a non-contacting relation. When the stage 15 is heated by the heater 15 to, for example, 140° C., a heat energy radiation is emitted from the stage 15 to the rear surface of the wafer W to heat the rear surface of the wafer W through the radiation heat energy. By doing so, the coated resist film 3 begins to be modified from the uneven surface side of the circuit pattern layer 2 and the modified portion is gradually grown to form a modified layer 3a of a desired thickness t5 (step S31). At this time, the surface (coated resist film 3) of the wafer is subjected, by the radiation cooling member 21, to radiation cooling. Further, a cooling gas is supplied to the surface of the wafer W via the nozzle 32 and an enhanced cooling effect is exerted over the surface portion of the coated resist film 3 through the gas cooling. By doing so, as shown in FIG. 8C, the modified layer 3a is formed from the rear surface (lower surface) of the wafer W and an unmodified portion remains a t the upper surface side of the wafer W to provide a non-modified layer 3b.

At the steps S30 and S31, the modified layer 3a may be formed by heating the wafer W while coating a resist solution on the wafer W. Further, the modified layer 3a may be formed by heating the wafer W while applying a resist solution to the wafer W under a lower temperature atmosphere in the container in which the coating step is being done.

Even after the stopping of the heating by the heater and the ending of the modified layer forming step S31, the radiation cooling by the radiation cooling member 21 and the gas cooling made via the nozzle 32 are continued to allow the wafer W to be immediately cooled in the baking unit 90 (step S32). It is to be noted that, at t he step S6, the wafer W may be cooled in the cooling unit 85.

Then the wafer W is loaded into the coating unit 83 and an organic solvent is applied to the wafer W via a solvent nozzle to dissolve and remove only the non-modified layer 3b of the resist film (step S33). By doing so, a resist's modified layer 3a of a substantially uniform thickness is left on the wafer W. The average thickness t5 of the modified layer 3a is 200 nm. In this step S33, it is preferable to use chemicals, such as a substance for allowing only the non-modified layer 3b of the resist film to be dissolved and a substance by which the rate of dissolution of the modified layer 3a is extremely lowered. As such chemicals use can be made of various kinds of thinners and developing solutions. It may be possible to remove the non-modified layer 3b by the ashing processing and, in this case, the ashing condition is such as to lower the rate of ashing of the modified layer 3a.

As shown in FIG. 8D, the exposed surface of the resist's modified layer 3a is uneven and there is a risk that exposure light will be scattered on the uneven surface portions of the modified layer. It is, therefore, necessary to smooth the uneven surface of the exposed layer flat. The wafer W is loaded into any of the baking units 86, 88, 90 and heated to a predetermined temperature. By doing so, the resist's modified layer 3a has its surface or surface layer softened and an unrequired solvent containing that surface layer is volatilized, so that, as shown in FIG. 8E, the surface of the modified layer 3a is smoothed flat (step S34). The heating conditions at the step S34 are set at a temperature of 80 to 120° C. for a heating time of 60 to 120 seconds. The thus processed wafer W is stored in the cassette C3 at the interface section 96 (step S35). It is to be noted that, after the step S35, a series of light exposing and developing steps as shown in steps S10 to S18 is carried out.

Although, in the above-mentioned embodiment, the resist film and anti-reflection film are formed over the uneven pattern of the substrate, the present invention is not restricted thereto and the resist film and anti-reflection film may be formed using other coating methods.

Further, the substrate as an object to be processed is not restricted to the semiconductor wafer only and the present invention can also be applied to a substrate for a liquid crystal display (LCD)

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resist processing method comprising the steps of:

(a) to a substrate having a circuit pattern with an uneven surface formed thereon, coating a photoresist solution to form a photoresist film;

(b) chemically modifying a part of the photoresist film by heating the photoresist film from a reverse side of the substrate while cooling the photoresist film from a front side of the substrate, so that a modified resist layer of a substantially uniform thickness is formed from the uneven surface of the circuit pattern;

(c) removing only a layer unmodified at the step (b) by bringing the photoresist film into contact with an organic solvent, thereby leaving the modified resist layer on the uneven surface;

(d) patterning the modified resist layer by means of light exposure; and (e) post-exposure-baking the exposed modified resist layer.

2. The method according to claim 1, wherein, in the step (b), the substrate is placed on a stage in a manner to partially support only a marginal edge portion of the substrate in a contacting state and a heat energy radiation is emitted from the stage side to the reverse side of the substrate.

3. The method according to claim 1, wherein, in the step (b), a radiation cooling plate is moved nearer the front side of the substrate to cool the photoresist film through radiation cooling.

4. The method according to claim 1, wherein, in the step (b), a cooling gas is supplied to the front side of the substrate to cool the photoresist film.

5. The method according to claim 1, wherein, in the step (a), the substrate, being spun, is supplied, at a center area thereof, with the resist solution to cause the resist solution to be diffused under a centrifugal action over a whole front of the substrate.

6. The method according to claim 1, further comprising the step of, subsequent to the step (c), heating the modified resist layer to smooth the surface of the modified resist layer.

7. The method according to claim 1, wherein the photoresist is dissolvable in an organic solvent before being modified at the step (b) and not dissolvable in the organic solvent after being modified at the step (b).

8. The method according to claim 1, further comprising, before the step (a), the step of forming an anti-reflection coating film by covering the uneven surface of the circuit pattern with a hard-to-reflect bottom anti-reflection coating film.

9. The method according to claim 8, further comprising the steps of:

(A) coating the uneven surface of the circuit pattern with a solution for the bottom anti-reflection coating film before said step (a);

(B) chemically modifying a part of the bottom anti-reflection coating film by heating the bottom anti-reflection coating film from a reverse side of the substrate while cooling the bottom anti-reflection coating film from a front side of the substrate, so that a modified bottom anti-reflection coating layer of a substantially uniform thickness is formed from the uneven surface of the circuit pattern; and (C) removing only an unmodified layer at the step (B) by bringing the bottom anti-reflection coating film into contact with an organic solvent, thereby leaving the modified bottom layer on the uneven surface.

10. The method according to claim 9, wherein, in the step (B), the substrate is placed on a stage in a manner to partially support only a marginal edge portion of the substrate in a contacting state and a heat energy radiation is emitted from the stage side toward the reverse side of the substrate.

11. The method according to claim 9, wherein, at the step (B), a radiation cooling plate is moved nearer the front side of the substrate to subject the anti-reflection film to radiation cooling.

12. The method according to claim 9, wherein, in the step (B), a cooling gas is supplied to the front side of the substrate to cool the anti-reflection film.

13. The method according to claim 9, wherein, at the step (A), the substrate, being spun, is supplied, at a center area thereof, with the solution for the anti-reflection coating film to cause the solution to be diffused under a centrifugal force over a whole front of the substrate.

* * * * *